(12) United States Patent
Tsuji

(10) Patent No.: US 11,070,168 B2
(45) Date of Patent: Jul. 20, 2021

(54) OSCILLATOR CIRCUIT

(71) Applicant: ROHM CO., LTD., Kyoto (JP)

(72) Inventor: Masanobu Tsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/876,500

(22) Filed: May 18, 2020

(65) Prior Publication Data

US 2020/0366241 A1 Nov. 19, 2020

(30) Foreign Application Priority Data

May 17, 2019 (JP) .............................. JP2019-094027

(51) Int. Cl.
*H03B 5/04* (2006.01)
*H03B 5/24* (2006.01)
(52) U.S. Cl.
CPC ................ *H03B 5/04* (2013.01); *H03B 5/24* (2013.01)
(58) Field of Classification Search
CPC ........................................................ H03B 5/04
USPC ................................................................ 331/66
See application file for complete search history.

(56) References Cited

U.S. PATENT DOCUMENTS

| 6,028,905 | A | * | 2/2000 | Gaines | ............ | H03L 7/107 |
| | | | | | | 375/376 |
| 2019/0235566 | A1 | * | 8/2019 | Ensafdaran | ........ | H03K 5/00006 |
| 2019/0379382 | A1 | * | 12/2019 | Tagatac | ............ | H03L 1/026 |
| 2020/0313616 | A1 | * | 10/2020 | Tsuji | ............ | H03B 5/1228 |

* cited by examiner

*Primary Examiner* — Joseph Chang
(74) *Attorney, Agent, or Firm* — Cantor Colburn LLP

(57) ABSTRACT

A variable-frequency oscillator generates an oscillator clock having a frequency that corresponds to a control signal. A programmable frequency divider divides the oscillator clock, so as to generate a divided clock. A F/V converter circuit includes a capacitor and a switch that switches at a frequency that corresponds to the divided clock, and generates a detection voltage that corresponds to a reference current. A reference voltage source outputs a reference voltage that corresponds to the electric potential that occurs at the resistor due to a reference current. A feedback circuit adjusts a control signal such that the detection voltage approaches the reference voltage. A correction circuit changes the frequency-dividing ratio of the programmable frequency divider based on a modulation signal modulated according to a correction coefficient that corresponds to the temperature.

14 Claims, 12 Drawing Sheets

OSCILLATOR CIRCUIT

CROSS REFERENCE TO RELATED APPLICATIONS

The present invention claims priority under 35 U.S.C. § 119 to Japanese Application No. 2019-094027 filed May 17, 2019, the entire content of which is incorporated herein by reference.

BACKGROUND OF THE INVENTION

1. Field of the Invention

The present invention relates to an oscillator circuit integrated on a semiconductor chip.

2. Description of the Related Art

Digital circuits and frequency synthesizers require a reference clock for their operation. An oscillator is employed to generate such a reference clock. Examples of oscillators include oscillators employing quartz resonators, ceramic resonators and MEMS (Micro Electro Mechanical Systems) resonators, LC oscillators, CR oscillators, ring oscillators, multi-vibrators, relaxation oscillators, and the like.

Oscillators employing quartz resonators, ceramic resonators, MEMS resonators, or the like support high-precision clock generation. However, such oscillators cannot be manufactured using a typical semiconductor process. Accordingly, such an arrangement requires an external oscillator as an additional component, leading to an increased cost.

In a case in which such an oscillator is to be integrated on a semiconductor chip, such an arrangement employs a CR oscillator, ring oscillator, multi-vibrator, relaxation oscillator, or the like. However, such an oscillator has a problem in that its oscillation frequency varies depending on manufacturing variation, temperature fluctuation, and voltage fluctuation. Accordingly, it is difficult for such an arrangement to provide high-precision frequency stabilization.

As a relatively high-precision oscillator that can be integrated on a semiconductor chip, a feedback-loop oscillator has been proposed. FIG. 1 is a block diagram showing a feedback-loop oscillator. A feedback-loop oscillator 1 includes a voltage controlled oscillator (VCO) 2, a frequency divider 4, a F/V (frequency-voltage) converter circuit 6, a reference voltage source 8, an error amplifier 10, and a filter 12.

The voltage controlled oscillator 2 oscillates at a frequency according to a control voltage $V_{CTRL}$. The frequency divider 4 divides the frequency of an output clock CLKOSC of the voltage controlled oscillator 2 by 1/N. The F/V converter circuit 6 can be regarded as a switched capacitor circuit including a capacitor C and a switch SW. The switched capacitor circuit has an equivalent resistance of $1/(C \times f_{SW})$. Accordingly, when a reference current $I_{REF1}$ flows through the equivalent resistance, a detection voltage $V_C$ is generated as represented by Expression (1).

$$V_C \propto I_{REF1}/(C \times f_{SW}) \quad (1)$$

The detection voltage $V_C$ is inversely proportional to the capacitance C and the switching frequency $f_{SW}$ (i.e., frequency $f_{DIV}$ of the divided clock), and is proportional to the reference current $I_{REF1}$.

The reference voltage source 8 includes a resistor R. The reference voltage source 8 generates a reference voltage $V_R$ that is proportional to the resistance R and a reference current $I_{REF2}$.

$$V_R \propto I_{REF2} \times R \quad (2)$$

The error amplifier (comparator) 10 amplifies the difference between the reference voltage $V_R$ and the detection voltage $V_C$. The filter 12 smooths the output of the error amplifier 10, so as to generate the control voltage $V_{CTRL}$.

The feedback-loop oscillator 1 provides a feedback operation such that the relation $V_C = V_R$ holds true, i.e., so as to satisfy the following Expression (3).

$$I_{REF1}/(C \times f_{DIV}) = I_{REF2} \times R \quad (3)$$

Accordingly, when the relation $I_{REF1} = I_{REF2}$ holds true, in a stable feedback-loop control operation, the frequency $f_{DIV}$ of the divided clock CLKDIV and the frequency $f_{OSC}$ of the oscillator clock CLKOSC are represented by the following Expressions (4) and (5), respectively.

$$f_{DIV} = 1/CR \quad (4)$$

$$f_{OSC} = N \times f_{DIV} = N/CR \quad (5)$$

As a result of investigating the feedback-loop oscillator 1 shown in FIG. 1, the present inventor has come to recognize the following problems.

The capacitance of the capacitor C and the resistance value of the resistor R, which are each employed as a reference value for determining the frequency, have temperature dependence. Accordingly, the frequency $f_{DIV}$ represented by Expression (4) has temperature dependence. With such an oscillator, in order to control a given frequency with high precision in the operation thereof, the capacitance C or the resistance R, which is employed as a reference value, is required to be controlled with high precision. It is difficult for such an arrangement to support intentional frequency shifting or modulation control.

SUMMARY OF THE INVENTION

The present invention has been made in order to solve such problems. Accordingly, it is an exemplary purpose of one embodiment to provide an oscillator circuit having reduced temperature dependence and/or to provide an oscillator circuit that is capable of generating and controlling a given frequency with high precision in the operation thereof.

One embodiment of the present invention relates to an oscillator circuit. The oscillator circuit comprises: a variable-frequency oscillator structured to generate an oscillator clock having a frequency that corresponds to a control signal; a programmable frequency divider structured to divide the oscillator clock so as to generate a divided clock; a F/V (frequency/voltage) converter circuit comprising a capacitor and a switch structured to switch at a frequency that corresponds to the divided clock, and structured to generate a detection voltage that corresponds to a reference current; a reference voltage source comprising a resistor, and structured to output a reference voltage that corresponds to an electric potential that occurs across the resistor due to the reference current; a feedback circuit having low-pass filter characteristics that adjusts the control signal such that the detection voltage approaches the reference voltage; a temperature sensor structured to detect the temperature; and a correction circuit structured to change a frequency-dividing ratio to be set for the programmable frequency divider, based on a modulation signal modulated according to a correction coefficient that corresponds to the temperature.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Overview of the Embodiments

Figure 1:
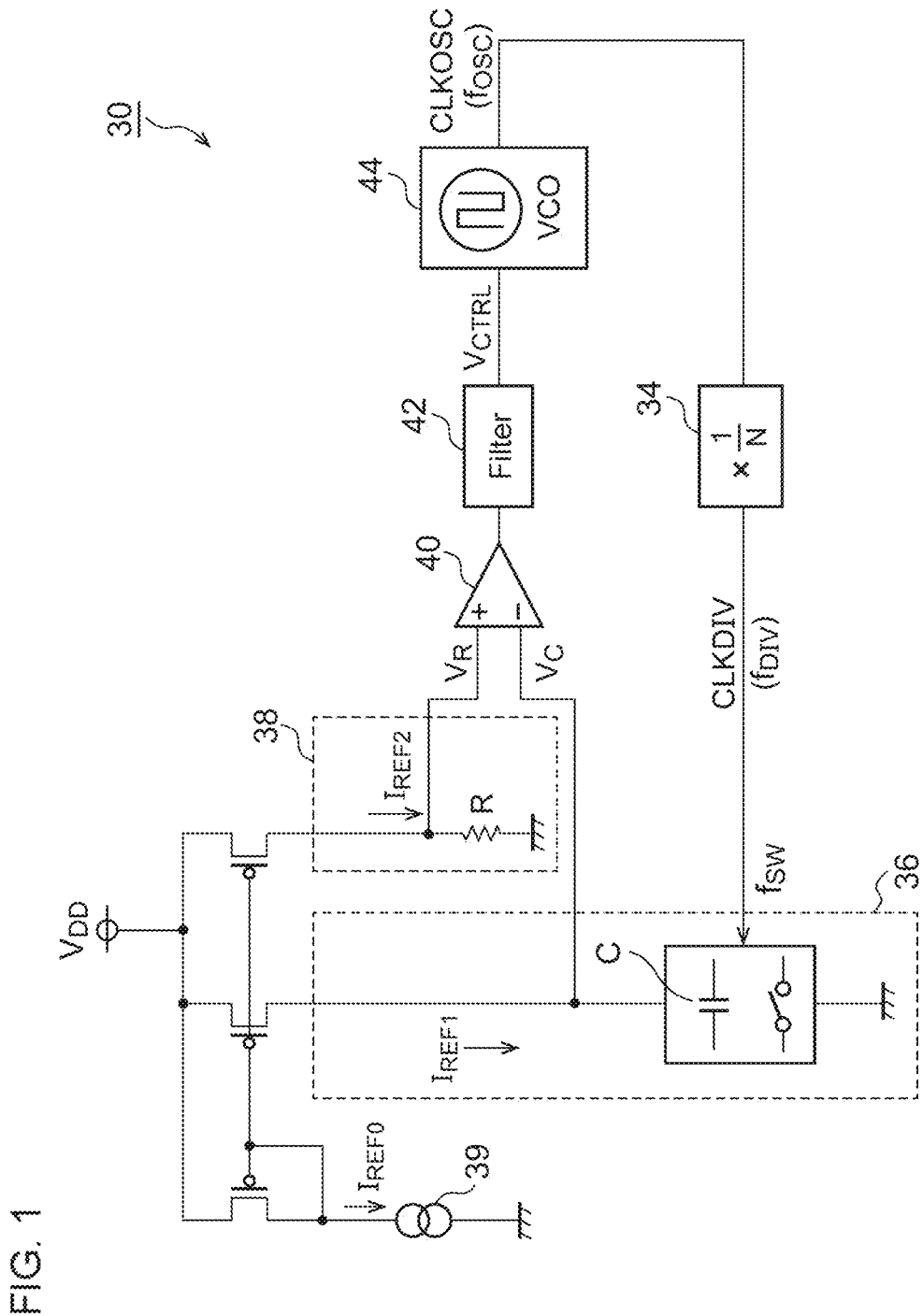
FIG. 1 is a block diagram showing a feedback-loop oscillator.

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later.

One embodiment disclosed in the present specification relates to an oscillator circuit. The oscillator circuit comprises: a variable-frequency oscillator structured to generate an oscillator clock having a frequency that corresponds to a control signal; a programmable frequency divider structured to divide the oscillator clock so as to generate a divided clock; a F/V (frequency/voltage) converter circuit comprising a capacitor and a switch structured to switch at a frequency that corresponds to the divided clock, and structured to generate a detection voltage that corresponds to a reference current; a reference voltage source comprising a resistor, and structured to output a reference voltage that corresponds to an electric potential that occurs across the resistor due to the reference current; a feedback circuit having low-pass filter characteristics that adjusts the control signal such that the detection voltage approaches the reference voltage; a temperature sensor structured to detect the temperature; and a correction circuit structured to change a frequency-dividing ratio to be set for the programmable frequency divider, based on a modulation signal modulated according to a correction coefficient that corresponds to the temperature.

With this embodiment, the frequency-dividing ratio of the frequency divider is modulated according to the correction coefficient that corresponds to the temperature, thereby providing a fractional operation. This allows the temperature characteristics with respect to the frequency to be flattened. Furthermore, this allows a desired frequency to be generated and controlled with high precision.

Also, the correction circuit may generate a modulation signal based on a control value generated according to a correction coefficient that corresponds to the temperature and a value generated by incrementing/decrementing a control value generated according to an arbitrary frequency.

Also, the correction circuit may comprise: a calculation unit structured to output the correction coefficient that corresponds to the temperature; and a delta-sigma modulator structured to modulate the correction coefficient.

Also, the order of a low-pass filter included in the feedback circuit may be equal to or higher than that of the delta-sigma modulator. This allows quantization noise that occurs due to the delta-sigma modulator to be appropriately removed.

Also, the feedback circuit may comprise a clocked comparator structured to compare the detection voltage with the reference voltage, and a filter circuit. Also, the F/V converter circuit may comprise an initialization switch coupled in parallel with the capacitor, and structured to charge or discharge the capacitor using the reference current, so as to generate the detection voltage. Also, the oscillator circuit may further comprise a timing generator comprising a fixed frequency divider structured to divide the divided clock, and structured to generate a timing signal for controlling the initialization switch and the clocked comparator. Also, a combination of the programmable frequency divider, the fixed frequency divider of the timing generator, and the delta-sigma modulator may operate as a pulse swallow counter.

In the F/V converter circuit, during the time $T_{CHG}$ that is proportional to the period of the divided clock, the capacitor C is charged or discharged using the reference current $I_{REF1}$. As a result, a voltage change represented by $(I_{REF1} \times T_{CHG}/C)$ occurs in the detection voltage $V_C$. A feedback operation is applied such that the change in voltage matches the reference voltage $V_R=(I_{REF2} \times R)$, thereby stabilizing the charging time $T_{CHG}$ to CR. The charging time is proportional to the divided clock, i.e., the period of the oscillator clock. Accordingly, such an arrangement is capable of obtaining the oscillator clock having a frequency that is proportional to (N/CR).

Also, the calculation unit may calculate the correction coefficient in the form of a polynomial expression with the temperature as a variable. This allows an increase in the hardware resources to be suppressed while providing sufficient correction precision. The order of the polynomial expression may be set to 2.

The calculation unit may comprise a LUT (Lookup Table) that holds the relation between the temperature and the correction coefficient.

Also, the oscillator circuit may further comprise a FLL (Frequency Locked Loop) circuit structured to change the correction coefficient such that the frequency of the oscillator clock approaches a frequency of a reference clock input from an external circuit.

Also, the FLL circuit may be operated at multiple temperatures in the calibration mode. Also, a parameter for the correction circuit may be acquired based on multiple temperature coefficients acquired at the multiple temperatures.

Also, the capacitor may include a variable capacitance that can be controlled according to a control code. Also, an output of the FLL circuit may be employed as the control code.

Also, oscillator circuit may further comprise a path selector structured to switch a path through which the reference current passes, between a first path and a second path in a time sharing manner. Also, the capacitor of the F/V circuit may be coupled to the first path. Also, the resistor of the reference voltage source may be coupled to the second path. A common reference current is used for generating the reference voltage and the detection voltage. This arrangement is capable of reducing effects due to reference current fluctuation, thereby allowing the oscillator clock to be generated with high frequency precision.

EMBODIMENTS

The invention will now be described based on preferred embodiments which do not intend to limit the scope of the present invention but exemplify the invention. All of the features and the combinations thereof described in the embodiment are not necessarily essential to the invention.

In the drawings, the same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions of the connection state between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions of the connection state between them, in addition to a state in which they are directly coupled.

Figure 2:
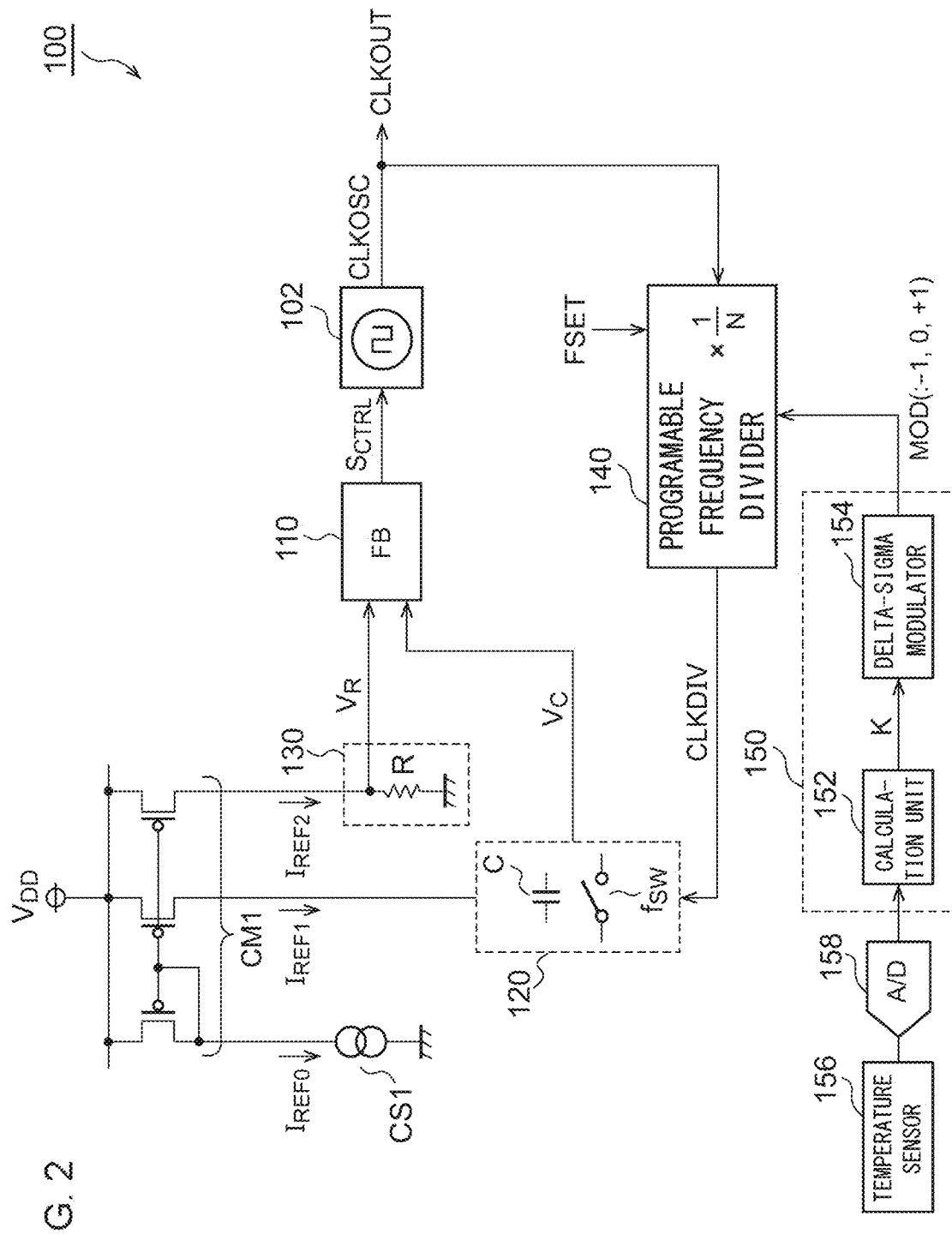
FIG. 2 is a circuit diagram showing an oscillator circuit according to one embodiment.

FIG. 2 is a circuit diagram showing an oscillator circuit 100 according to one embodiment. The oscillator circuit 100 generates an oscillator clock CLKOSC having a frequency four determined according to a resistor R and a capacitor C. The oscillator circuit 100 includes a variable-frequency oscillator 102, temperature sensor 156, A/D converter 158, F/V converter circuit 120, reference voltage source 130, feedback circuit 110, programmable frequency divider 140, and correction circuit 150, which are integrated on a single semiconductor substrate.

The variable-frequency oscillator 102 generates the oscillator clock CLKOSC having a frequency $f_{OSC}$ that corresponds to a control signal $S_{CTRL}$.

The programmable frequency divider 140 divides the frequency of the oscillator clock CLKOSC, so as to generate a divided clock CLKDIV. The frequency-dividing ratio (base frequency-dividing ratio) N, which is employed as a base value for the programmable frequency divider 140, can be set based on frequency setting data FSET.

The current $I_{REF0}$ generated by the reference current source CS1 is copied by a current mirror circuit CM1. The reference currents $I_{REF1}$ and $I_{REF2}$ having the same current value as that of the reference current $I_{REF0}$ are supplied to the F/V converter circuit 120 and the reference voltage source 130.

The F/V (frequency-voltage) converter circuit 120 includes a capacitance C and a switch SW that switches at a frequency $f_{SW}$ that corresponds to the divided clock CLKDIV. The F/V converter circuit 120 generates a detection voltage $V_C$ that corresponds to the reference current $I_{REF1}$.

The reference voltage source 130 includes a resistor R. The reference voltage source 130 outputs a reference voltage $V_R$ that corresponds to the electric potential ($R \times I_{REF2}$) that occurs across the resistor R due to the reference current $I_{REF2}$.

The feedback circuit 110 controls the control signal $S_{CTRL}$ such that the reference voltage $V_C$ approaches the reference voltage $V_R$.

The temperature sensor 156 detects the temperature T of the oscillator circuit 100. The output of the temperature sensor 156 is converted into a digital value by the A/D converter 158.

The correction circuit 150 raises or lowers the base frequency-dividing ratio N based on a modulation signal MOD modulated according to a correction coefficient K that corresponds to the temperature T, so as to acquire the frequency-dividing ratio N' to be used for the programmable frequency divider 140. For example, the instantaneous value of the modulation signal MOD is switchable between three values, i.e., 0, −1, and +1. In a case in which the base frequency-dividing ratio N=16, the frequency-dividing ratio N' is switched between three values, i.e., 15, 16, and 17.

The correction circuit 150 includes a calculation unit 152 and a delta-sigma modulator 154. The calculation unit 152 outputs the correction coefficient K (−1 to +1) that corresponds to the temperature T. The calculation unit 152 may calculate the coefficient K based on a predetermined calculation expression. Also, the calculation unit 152 may include a LUT (lookup table) that holds the relation between the temperature T and the coefficient K, and may output the coefficient K by referring the table. The delta-sigma modulator 154 delta-sigma modulates the correction coefficient K, so as to output the modulation signal MOD. The average value of the modulation signal MOD is used as the correction coefficient K. The relation between the temperature T and the correction coefficient K is determined such that the frequency of the oscillator clock CLKOSC is maintained at a constant value regardless of the occurrence of temperature fluctuation. The relation can be acquired by calibration as described later or by simulation.

The above is the oscillator circuit 100. Next, description will be made regarding the operation thereof.

The time average value of the modulation signal MOD is used as the coefficient K. Accordingly, the time average value of the frequency-dividing ratio N' of the programmable frequency divider 140 is represented by $N_{AVE}=N+K$. The coefficient K can be set to a non-integer value. This allows the programmable frequency divider 140 to operate as a fractional divider.

The oscillation frequency $f_{OSC}$ of the variable-frequency oscillator 102 is represented by Expression (6).

$$f_{OSC}=N/CR \quad (6)$$

The change in the temperature leads to a change in the capacitance C and the resistance R. With the oscillator circuit 100 shown in FIG. 2, the frequency-dividing ratio N' is adjusted so as to cancel out the change in the capacitance C and the resistance R. This allows the oscillation frequency $f_{OSC}$ to be maintained at a constant value that does not depend on the temperature.

The present invention encompasses various kinds of apparatuses and methods that can be regarded as a block configuration or a circuit configuration shown in FIG. 2, or that can be derived from the aforementioned description. That is to say, the present invention is not restricted to a specific configuration. More specific description will be made below regarding example configurations and examples for clarification and ease of understanding of the essence of the present invention and the operation. That is to say, the following description will by no means be intended to restrict the technical scope of the present invention.

First Example

Figure 3:
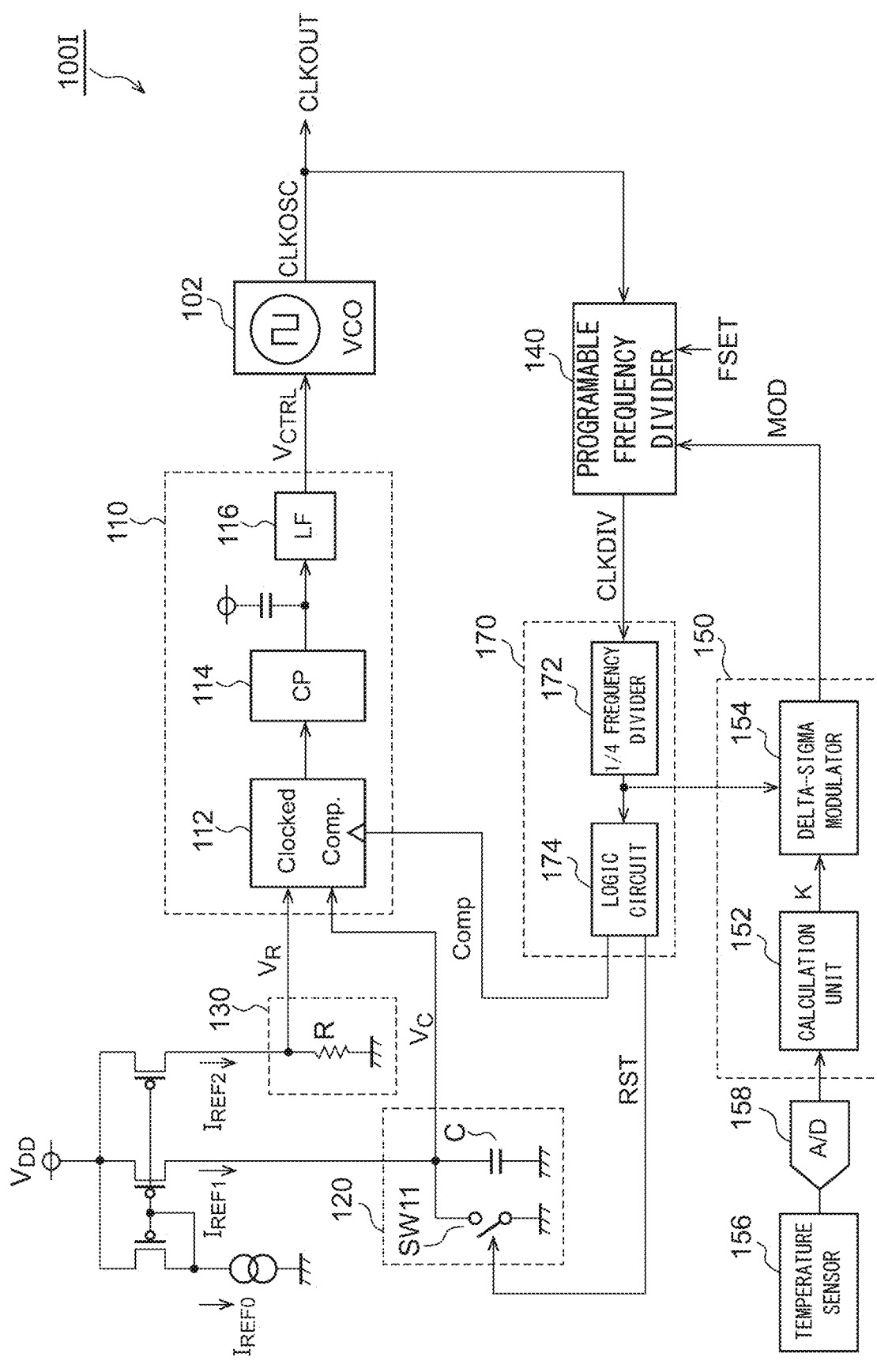
FIG. 3 is a circuit diagram showing an oscillator circuit according to a first example.

FIG. 3 is a circuit diagram showing an oscillator circuit 100I according to a first example. A feedback circuit 110 includes a clocked comparator 112, a charge pump 114, and a loop filter 116. The clocked comparator 112 compares a detection voltage $V_C$ with a reference voltage $V_R$ in synchronization with a comparison (COMP) signal, which is a timing signal generated by a timing generator 170. The charge pump 114 charges and discharges a capacitor $C_{CP}$ according to an up signal UP and a down signal DN that correspond to the output of the clocked comparator 112. The voltage $V_{CP}$ that occurs across the capacitor $C_{CP}$ is input to the variable-frequency oscillator 102 via the loop filter 116. The variable-frequency oscillator 102 is configured as a VCO (Voltage Controlled Oscillator) which oscillates at a frequency that corresponds to the control voltage $V_{CTRL}$.

The F/V converter circuit 120 includes a capacitor C and an initialization switch SW11. The initialization switch SW11 is coupled in parallel with the capacitor C. The initialization switch SW11 is on/off controlled according to an initialization (RST) signal, which is a timing signal generated by the timing generator 170. During a charging period $T_{CHG}$ in which the initialization switch SW11 is turned off, the capacitor C is charged using the reference current $I_{REF1}$, which generates the detection voltage $V_C$. After the charging period $T_{CHG}$ elapses, the detection voltage $V_C$ is represented by the following Expression (7).

$$V_C=I_{REF1} \times T_{CHG}/C \quad (7)$$

The reference voltage $V_R$ generated by the reference voltage source 130 is represented by the following Expression (8).

$$V_R=I_{REF2} \times R \quad (8)$$

The timing generator 170 includes a fixed frequency divider 172 and a logic circuit 174. The fixed frequency divider 172 further divides the frequency of the divided clock CLKDIV with a predetermined frequency-dividing ratio (e.g., 1/4).

The timing generator 170 logically combines the output CLKDIV' of the fixed frequency divider 172 and the original divided clock CLKDIV, so as to generate timing signals (RST, COMP).

Figure 4:
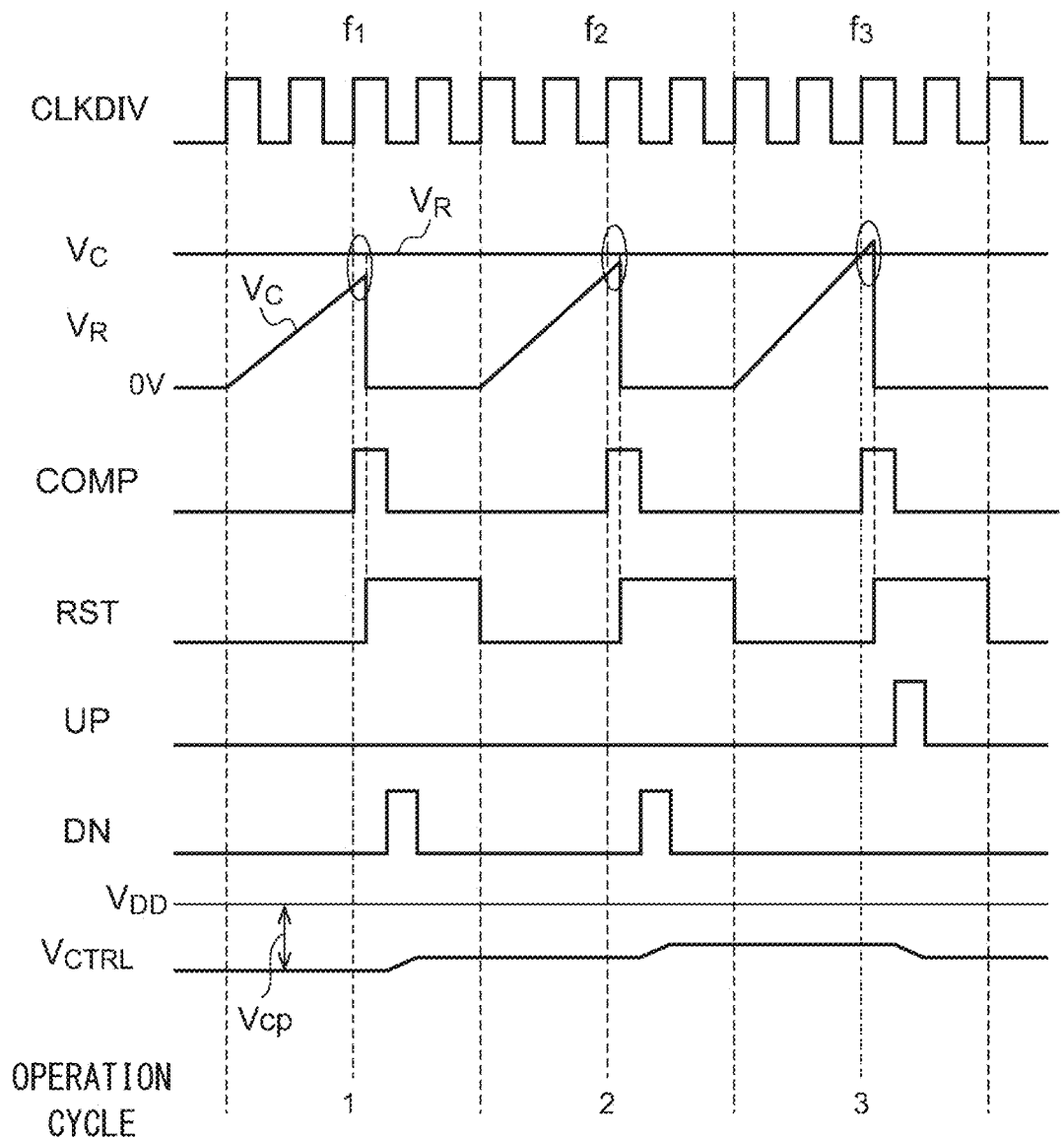
FIG. 4 is an operation waveform diagram showing the operation of the oscillator circuit shown in FIG. 3.

Description has been made above regarding the basic configuration of the oscillator. Next, description will be made regarding an example operation thereof. FIG. 4 is an operation waveform diagram showing the operation of the oscillator circuit 100I shown in FIG. 3. Description will be made below regarding a case in which the frequency-dividing ratio set for the programmable frequency divider 140 is fixed assuming that the temperature fluctuation is negligible. FIG. 4 shows waveforms of three consecutive operation cycles. Here, "$f_1$", "$f_2$", and "$f_3$" represent the oscillation frequencies $f_{OSC}$ set in the first, second, and third operation cycles, respectively.

In this example, the oscillator circuit 100I operates with four cycles of the divided clock CLKDIV as one operation cycle.

From among the four cycles of the divided clock CLKDIV, in the first two cycles, the capacitor C is charged using the reference current $I_{REF1}$. In the third cycle, the COMP signal is asserted, and the detection voltage $V_C$ is compared with the reference voltage $V_R$. The UP signal or the DN signal is asserted according to the comparison result. After the comparison is completed according to the assertion of the COMP signal, a RST signal is set to the high level, and the detection voltage $V_C$ is reset.

Description will be made directing attention to the first operation cycle. During a charging time $T_{CHG1}$ that corresponds to two cycles of the divided clock CLKDIV, the reference current $I_{REF1}$ is supplied to the capacitor C, which raises the detection voltage $V_C$. In response to the assertion of the COMP signal, the clocked comparator 112 compares the detection voltage $V_C$ with the reference voltage $V_R$. In the first operation cycle, the relation $V_C<V_R$ holds true, and accordingly, the DN signal is asserted. In response to the assertion of the DN signal, the charge pump voltage $V_{CP}$ is lowered, and the control voltage $V_{CTRL}$ is raised. This lowers the oscillation frequency $f_2$ in the next operation cycle ($f_1>f_2$). This arrangement is configured such that the frequency $f_{OSC}$ of the variable-frequency oscillator 102 has a negative correlation with respect to the control voltage $V_{CTRL}$.

The oscillator circuit 100I operates in the same manner in the second operation cycle. In this cycle, the frequency $f_{DIV}$ of the divided clock CLKDIV is lowered, which increases the charging time $T_{CHG2}$. Accordingly, the detection voltage $V_C$ has a peak that is higher than that in the previous operation cycle. Subsequently, the voltage comparison is performed according to the COMP signal. Also in this operation cycle, the relation $V_C<V_R$ holds true, and accordingly, the DN signal is asserted. In response to the assertion of the DN signal, the charge pump voltage $V_{CP}$ is lowered, and the control voltage $V_{CTRL}$ is raised. This further lowers the oscillation frequency $f_3$ in the next operation cycle ($f_2>f_3$).

In the third operation cycle, the charging time $T_{CHG3}$ is further increased. Accordingly, the peak of the detection voltage $V_C$ is further raised as compared with the previous operation cycle. In this operation cycle, the relation $V_R<V_C$ holds true. In this state, the UP signal is asserted. In response to the assertion of the UP signal, the charge pump voltage $V_{CP}$ is raised, and the control voltage $V_{CTRL}$ is lowered. This raises the oscillation frequency $f_4$ in the next operation cycle ($f_3 < f_4$).

By repeating this operation, this arrangement provides a feedback operation such that the relation $V_R = V_C$ holds true. In a state in which $V_C$ is stabilized to $V_R$ (frequency-locked state), the following Expression (9) holds true.

$$T_{CHG} = CR \times I_{REF2}/I_{REF1} \quad (9)$$

When the relation $I_{REF1} = I_{REF2}$ holds true, the following Expression (1) is obtained.

$$T_{CHG} = CR \quad (10)$$

That is to say, the charging time $T_{CHG}$ is stabilized to the time constant CR. The charging time $T_{CHG}$ is proportional to the period of the divided clock CLKDIV. With a proportional constant as "A", the period of the divided clock is represented by (A·CR). Accordingly, the frequency $f_{DIV}$ of the divided clock is represented by the following Expression (11).

$$f_{DIV} = 1/(A \cdot CR) \quad (11)$$

In the example shown in FIG. 4, the charging time $T_{CHG}$ corresponds to two cycles of the divided clock. Accordingly, the relation A=2 holds true.

When Expression (11) holds true, the frequency $f_{OSC}$ of the variable-frequency oscillator 102 is represented by the following Expression (12).

$$f_{OSC} = N \cdot f_{DIV} = N/(A \cdot CR) \quad (12)$$

The above is the basic operation of the oscillator. Returning to FIG. 3, description will be made regarding a configuration with respect to temperature correction.

The output CLKDIV' of the fixed frequency divider 172 is input to the delta-sigma modulator 154. The output of the delta-sigma modulator 154 changes in synchronization with the CLKDIV' signal. That is to say, the function of a pulse swallow counter is supported by a combination of the fixed frequency divider 172, the programmable frequency divider 140, and the delta-sigma modulator 154. It should be noted that the frequency-dividing ratio M of the fixed frequency divider 172 may preferably be determined so as to generate a timing signal for controlling the clocked comparator 112 and the F/V converter circuit 120 at an appropriate timing.

The delta-sigma modulator 154 may be configured as a second-order modulator, for example. In this case, the feedback circuit 110 is preferably configured to have second-order low-pass filter characteristics. This arrangement is capable of appropriately removing noise that occurs due to the delta-sigma modulator 154.

When the capacitance C and R fluctuate accompanying temperature fluctuation, the frequency-dividing ratio N represented by Expression (12) is finely adjusted to a non-integer value so as to cancel out the fluctuation, thereby stabilizing the oscillation frequency $f_{OSC}$.

Figure 5:
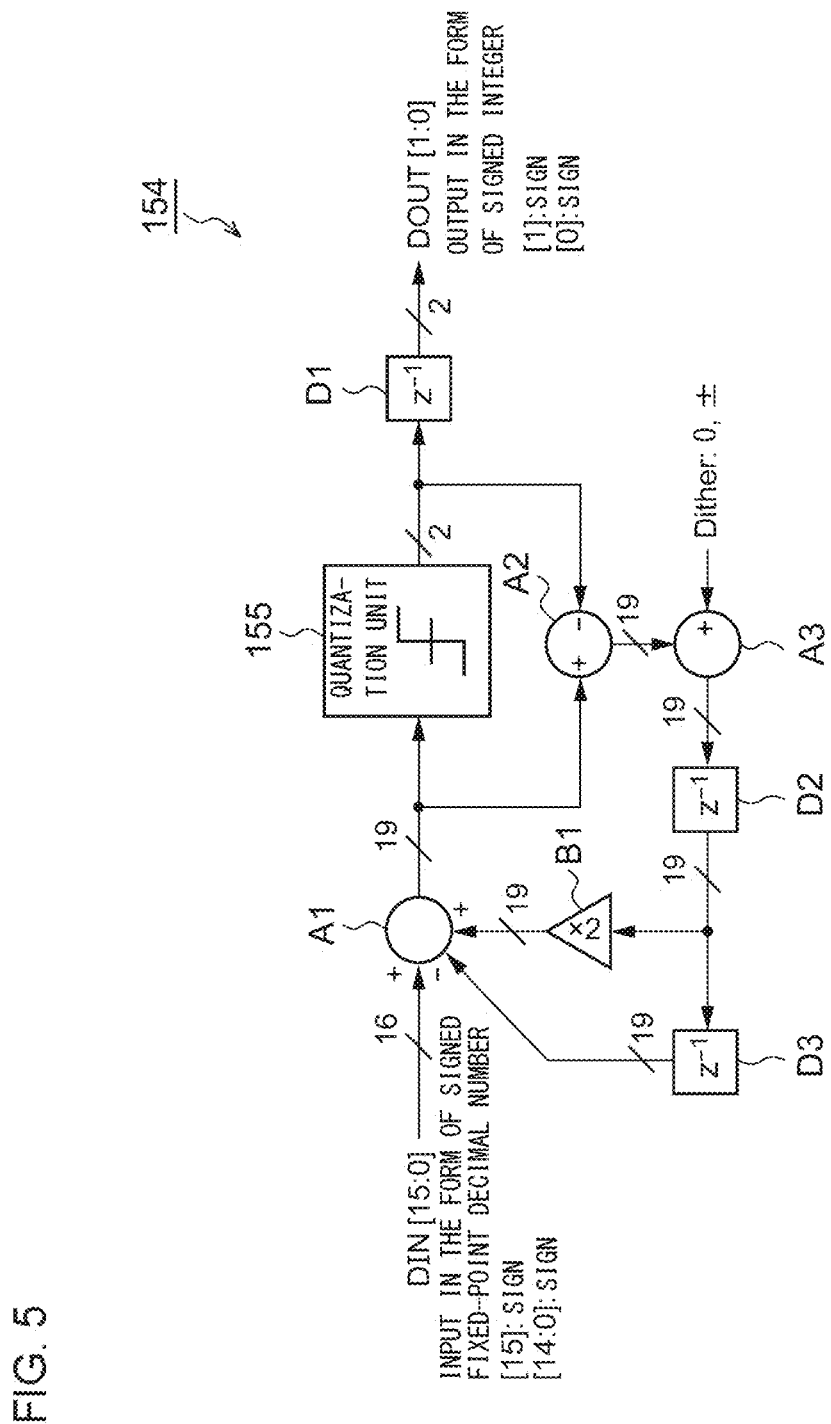
FIG. 5 is a circuit diagram showing an example configuration of a delta-sigma modulator.

FIG. 5 is a circuit diagram showing an example configuration of the delta-sigma modulator 154. The delta-sigma modulator 154 is configured as a second-order error-feedback modulator. The input signal DIN[15:0] of the delta-sigma modulator 154 is configured as a total of 16 bits including a sign bit supported by the MSB (DIN[15]) and 15-bit data supported by DIN[14:0] that represents a fixed-point decimal number. The input signal DIN[15:0] represents the correction coefficient K described above. On the other hand, the output OUT[1:0] of the delta-sigma modulator 154 corresponds to the modulation signal MOD described above. Here, the MSB (DOUT[1]) represents the sign. The LSB (DOUT[0]) represents a value, thereby allowing three values, i.e., −1, 0, and 1, to be represented.

The delta-sigma modulator 154 is configured of several adder/subtractor units A1, A2 and A3, a coefficient circuit B1, a quantization unit 155, and delay units D1, D2 and D3.

Dither may be supplied to the adder/subtractor unit A3. The least significant bit of the input signal DIN, i.e., DIN[0], may be used for the dither (self-dither). Also, an unshown pseudo-random signal PRBS generator may generate dither. The delta-sigma modulator 154 has second-order high-pass filter characteristics for noise.

Regarding Calibration

Figure 6:
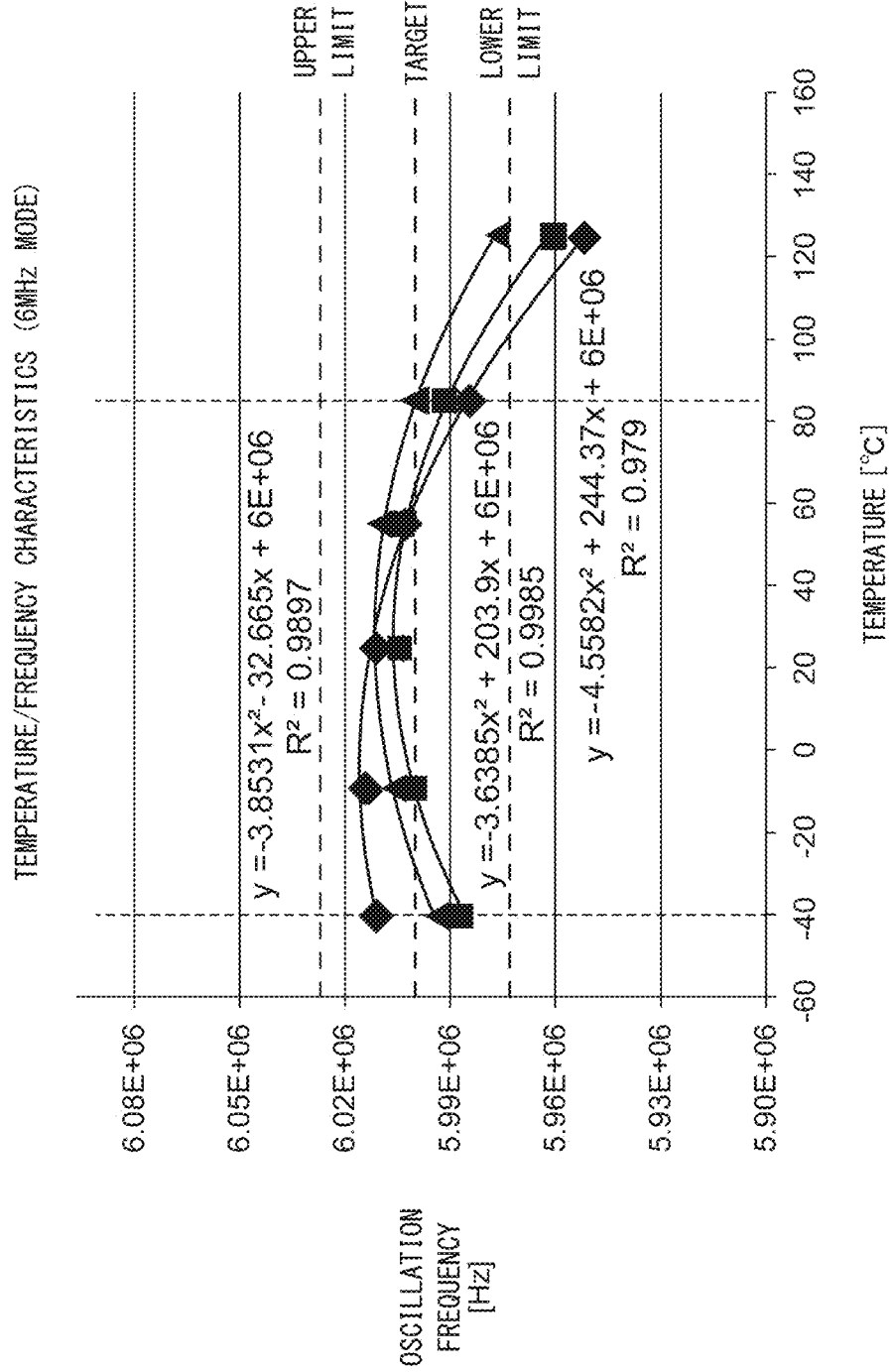
FIG. 6 is a diagram showing the temperature characteristics of the oscillation frequency of the oscillator circuit shown in FIG. 3 before correction.

FIG. 6 is a diagram showing the temperature characteristics of the oscillation frequency before correction employed in the oscillator circuit 100 shown in FIG. 3. The plots represent measurement values measured for three samples each designed with the target frequency $f_{TGT}$ as 6 MHz in a case in which the frequency-dividing ratio set for the programmable frequency divider 140 is fixed (i.e., the temperature correction function is disabled). The solid lines each represent a quadratic approximation curve (regression curve). As the correlation coefficients $R^2$, 0.979, 0.9985, and 0.9897 are obtained. Accordingly, it can be understood that the temperature characteristics can be satisfactorily approximated using such a quadratic polynomial expression.

Description will be made assuming that the oscillation frequency $f_{OSC}$ obtained when the frequency-dividing ratio of the programmable frequency divider 140 is fixed to the base frequency-dividing ratio is represented by a function with respect to the temperature T, i.e., $f_{OSC}=f(T)$. In this case, by correcting the frequency-dividing ratio N' of the programmable frequency divider 140 to $N'=N \times f_{TGT}/f(T)$, this arrangement is capable of canceling out the effects of temperature fluctuation. The correction coefficient K corresponds to $(N-N \times f_{TGT}/f(T))=N(1-f_{TGT}/f(T))$.

That is to say, it can be understood that, by calculating the correction coefficient K in the form of a quadratic polynomial expression with the temperature as a variable, such an arrangement provides sufficient correction precision.

Second Example

Figure 7:
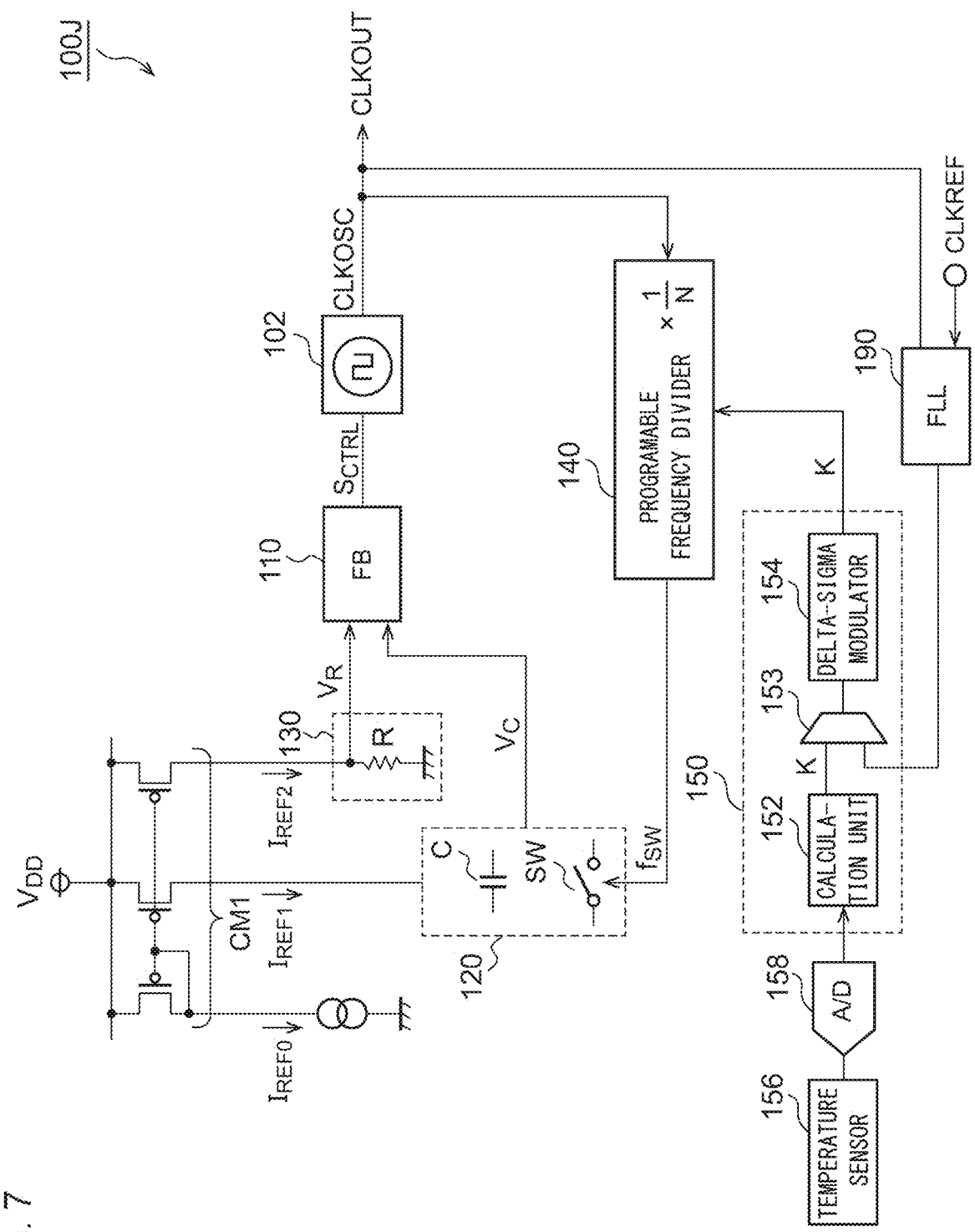
FIG. 7 is a block diagram showing an oscillator circuit according to a second example.

FIG. 7 is a block diagram showing an oscillator circuit 100J according to a second example. The oscillator circuit 100J further includes a FLL circuit 190 in addition to the configuration of the oscillator circuit 100 shown in FIG. 2. In the calibration mode, the FLL circuit 190 is set to the active state. The correction circuit 150 includes a selector 153. In the calibration mode, the selector 153 selects the output of the FLL circuit 190 (which will be referred to as a "second correction coefficient K'"). In the normal operation mode, the selector 153 selects the output of the calculation unit 152 (which will be referred to as a "first correction coefficient K"). The selector 153 supplies the selected output to the delta-sigma modulator 154.

In the calibration mode, a reference clock CLKREF having an accurate reference frequency $f_{REF}$ is supplied to the oscillator circuit 100J. The FLL circuit 190 changes its output (correction coefficient) K' such that the frequency $f_{OSC}$ of the oscillator clock CLKOSC (output clock CLKOUT) approaches the frequency $f_{REF}$ of the reference clock CLKREF input from an external circuit. The correction coefficient K' obtained in the frequency-locked state at a given temperature T is employed as the correction coefficient K to be generated by the calculation unit 152 in the actual operation.

The correction coefficient K can be approximated by a polynomial function (preferably a quadratic, linear, or higher-order function). Accordingly, with an example, the FLL circuit 190 may be operated at multiple temperatures $T_1$, $T_2$, ..., so as to acquire multiple coefficients $K_1'$, $K_2'$, ..., at the multiple temperatures $T_1$, $T_2$, ..., so as to acquire a regression curve K=f(T).

In a case in which the correction coefficient K is approximated by a quadratic function, the calculation expression to be held by the calculation unit 152 is represented by the following Expression (13).

$$K=f(T)=aT^2+bT+c \quad (13).$$

The correction coefficients $K_1'$, $K_2'$, and $K_3'$ are acquired at three temperatures, i.e., at an ordinary temperature (standard temperature, e.g., 30° C.) $T_1$, high temperature $T_2$, and low temperature T3, so as to calculate regression coefficients a, b, and c. The regression coefficients a, b, and c are held as parameters to be used in the calculation unit 152.

Figure 8A:
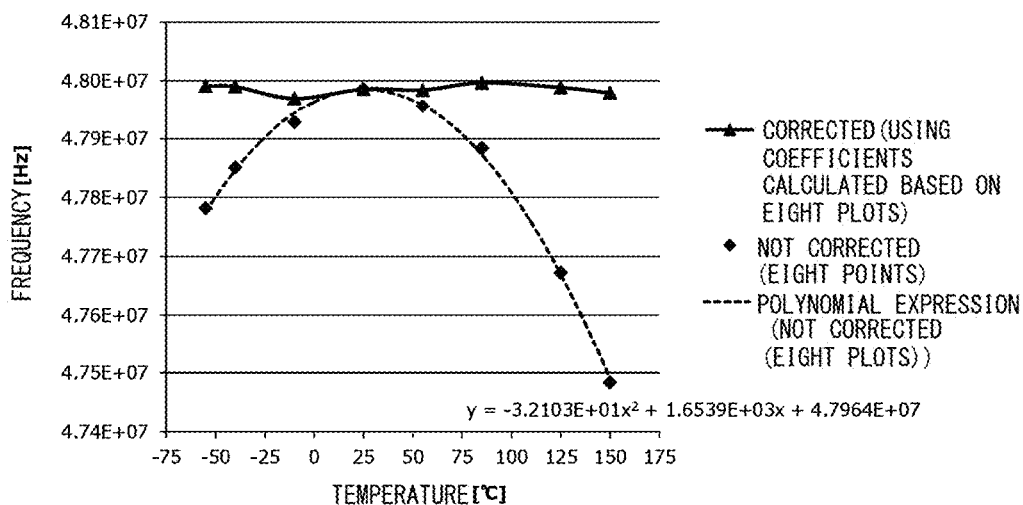
FIG. 8A and FIG. 8B are diagrams (simulation results) each showing the relation between the frequency before correction and the frequency after correction.
Figure 8B:
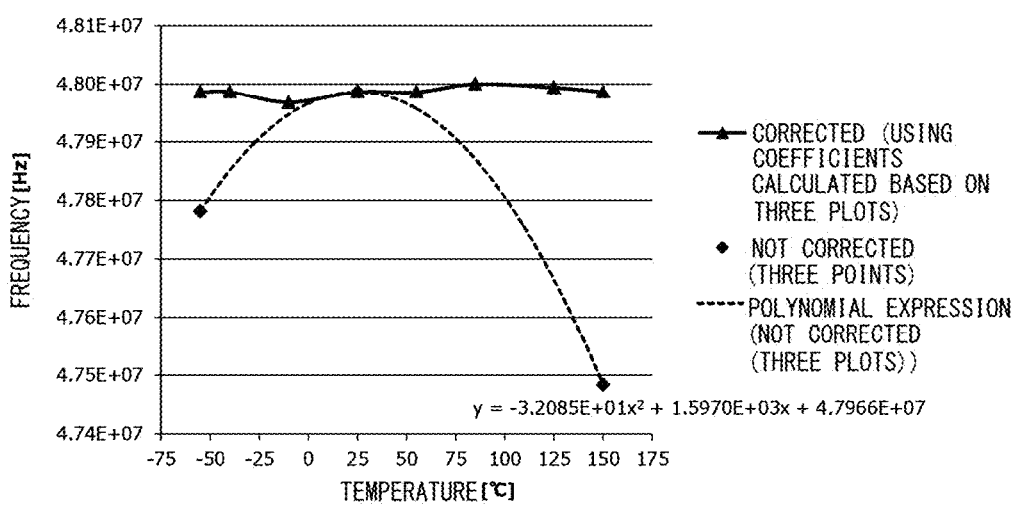

FIGS. 8A and 8B are diagrams (simulation results) each showing the temperature dependence of the frequency before and after correction. FIG. 8A shows a case in which the frequency before correction is corrected in the form of a regression curve acquired based on eight temperature plots. FIG. 8B shows a case in which the frequency before correction is corrected in the form of a regression curve acquired based on three temperature plots. It can be understood from the results that, in a case of employing second-order correction, a sufficient effect is obtained by measuring three temperature plots.

With the second example, in addition to the correction of fluctuation of the capacitance C and the resistance R due to temperature fluctuation, this arrangement allows the correction circuit 150 to correct process variation.

Third Example

Figure 9:
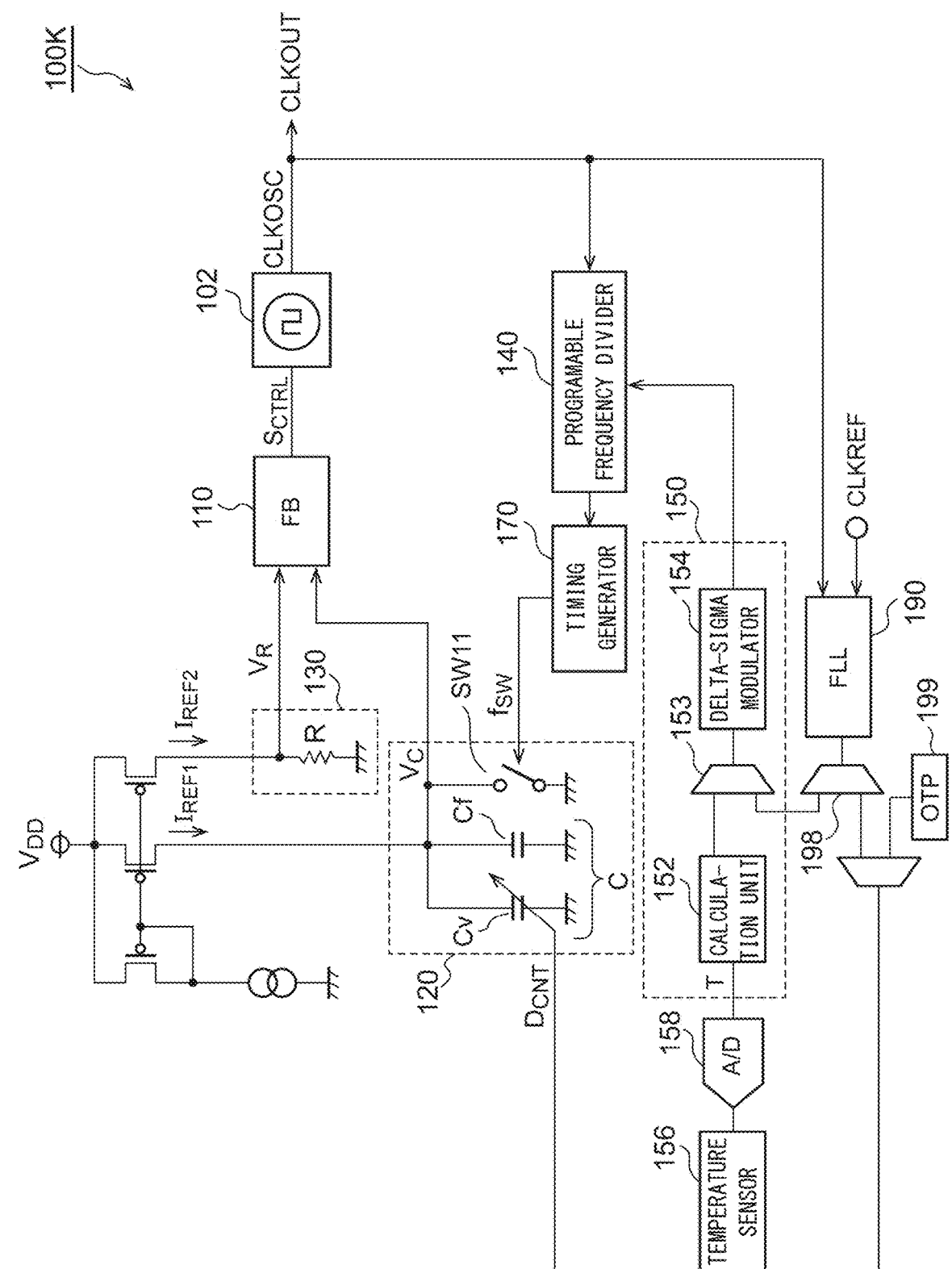
FIG. 9 is a circuit diagram showing an oscillator circuit according to a third example.

FIG. 9 is a circuit diagram showing an oscillator circuit 100K according to a third example. The capacitor C of the F/V converter circuit 120 includes a fixed capacitance C and a variable capacitance $C_V$ that can be controlled according to a control code $D_{CNT}$. The output of the FLL circuit 190 is coupled to a demultiplexer 198. This arrangement is configured to allow the FLL circuit 190 to supply its output as the control code $D_{CNT}$ to the variable capacitance $C_V$.

Description will be made regarding a calibration operation supported by the oscillator circuit 100K shown in FIG. 9.

In the calibration mode, the reference clock CLKREF is supplied from an external circuit. First, the temperature of the oscillator circuit 100 is stabilized to the standard temperature $T_0$ (e.g., an ordinary temperature of 30° C.). In this step, the correction circuit 150 is disabled. The demultiplexer 198 couples the output of the FLL circuit 190 to the variable capacitance $C_V$.

The oscillator circuit 100K is operated in this state. With this, the capacitance value of the variable capacitance $C_V$ is controlled such that the frequency $f_{OSC}$ matches the reference frequency $f_{REF}$. The output of the FLL circuit 190 in the frequency-locked state is held by OTP (One Time Programmable) memory 199 in a nonvolatile manner. Subsequently, the capacitance value of the variable capacitance $C_V$ is fixed. Furthermore, the output (temperature $T_0$) of the A/D converter 158 at this time is held.

This operation provides trimming of the capacitance C so as to cancel out the process variation of the capacitance C and the resistance R. With this, the correction coefficient K is set to zero at the temperature $T_0$. That is to say, in the third example, the calculation expression to be held by the calculation unit 152 is represented by Expression (14).

$$K=f(T)=a(T-T_0)^2+b(T-T_0) \quad (14)$$

Subsequently, the demultiplexer 198 is switched so as to supply the output of the FLL circuit 190 to the correction circuit 150. Furthermore, the correction circuit 150 is activated. This state provides the same state as that in the second example.

Subsequently, after the temperature T is stabilized to a given low temperature $T_1$, the FLL circuit 190 is operated so as to acquire the correction coefficient $K_1'$. Furthermore, after the temperature T is stabilized to a given high temperature $T_2$, the FLL circuit 190 is operated so as to acquire the correction coefficient $K_2'$. Subsequently, the two points, i.e., ($T_1$, $K_1'$) and ($T_2$, $K_2'$), are substituted into Expression (14), so as to solve the simultaneous equations using a substitution method, thereby acquiring the coefficients a and b.

Description has been made above regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Modification 1

Figure 10:
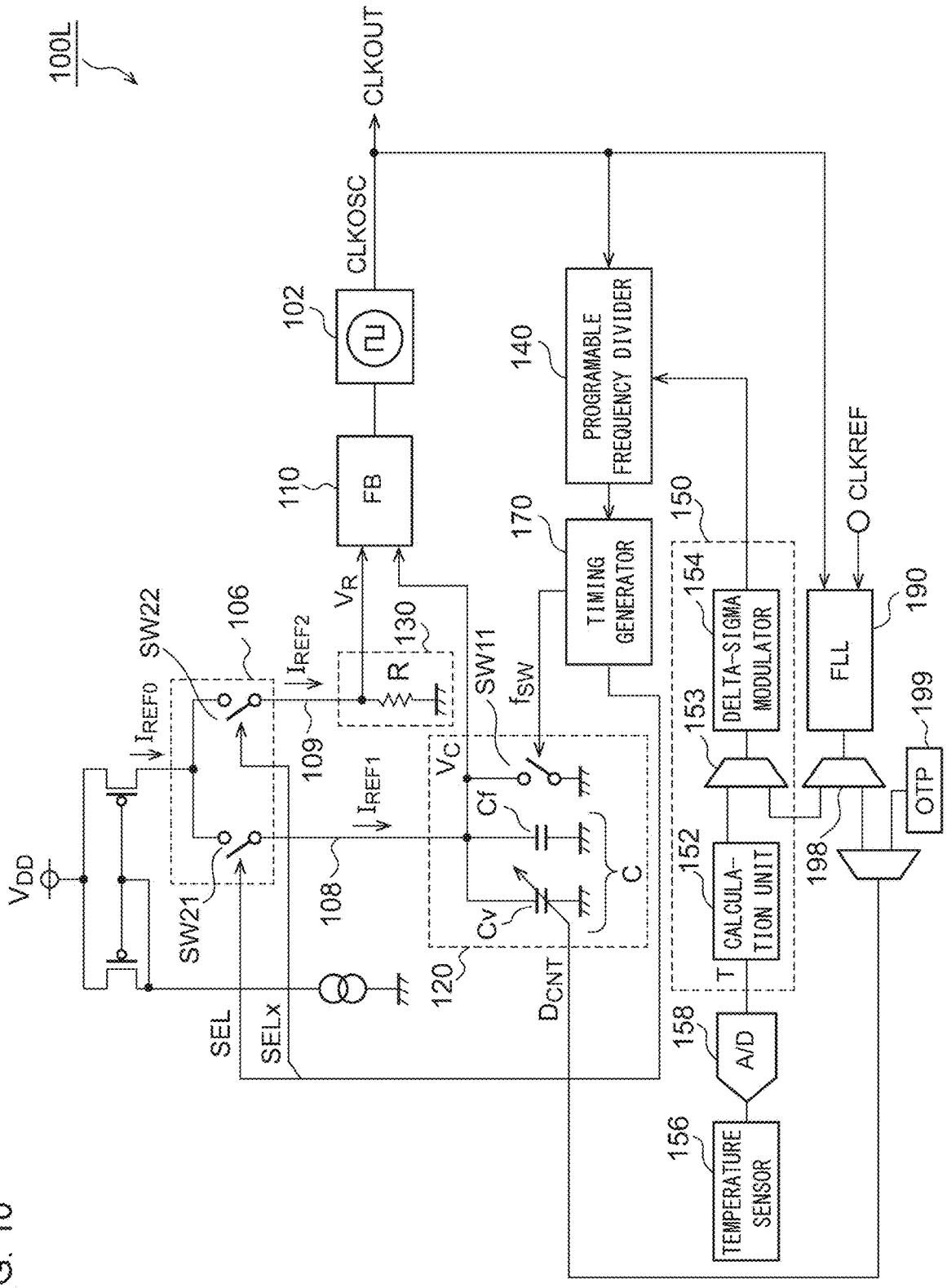
FIG. 10 is a circuit diagram showing an oscillator circuit according to a modification 1.

FIG. 10 is a circuit diagram showing an oscillator circuit 100L according to a modification 1. The oscillator circuit 100L further includes a path selector 106 in addition to the configuration of the oscillator circuit 100K shown in FIG. 9. The path selector 106 switches the path to which the reference current $I_{REF0}$ is to be applied between a first path 108 and a second path 109 in a time sharing manner according to a selection signal SEL (and inverted signal SELx) which is one form among the timing signals generated by the timing generator 170. The reference current $I_{REF1}$ that flows through the first path 108 and the reference current $I_{REF2}$ that flows through the second path 109 are each set to the reference current $I_{REF0}$.

$$I_{REF1}=I_{REF2}=I_{REF0}$$

The path selector 106 includes a first switch SW21 and a second switch SW22. The first switch SW21 and the second switch SW22 are controlled in a complementary manner according to the SEL signal and the inverted signal SELx thereof.

Figure 11:
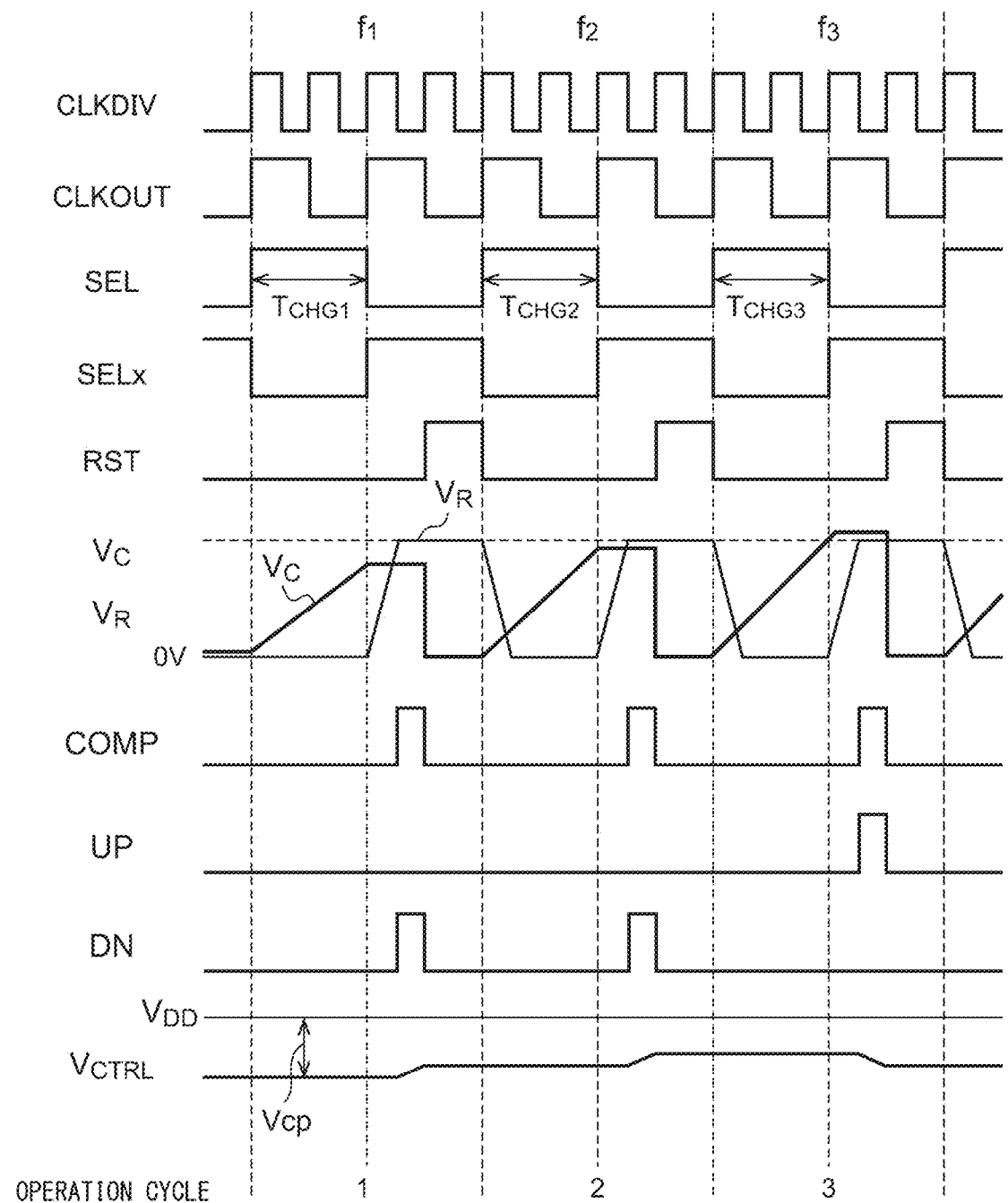
FIG. 11 is an operation waveform diagram showing the operation of the oscillator circuit shown in FIG. 10.

The above is the configuration of the oscillator circuit 100L. Next, description will be made regarding an example operation thereof. FIG. 11 is an operation waveform diagram showing the operation of the oscillator circuit 100L shown in FIG. 10. The basic configuration thereof is the same as that shown in FIG. 4. The point of difference is that, with the oscillator circuit 100L shown in FIG. 10, the reference voltage $V_R$ and the detection voltage $V_C$ are alternately generated in a time sharing manner. The two voltages $V_R$ and $V_C$ are sampled and held at an appropriate timing, and the two voltages $V_R$ and $V_C$ thus sampled and held are compared. This arrangement provides the same operation as that provided by the above-described example. It should be noted that, with this modification, the capacitor C of the F/V converter circuit 120 itself provides a function of holding the detection voltage $V_C$.

This modification provides the following effects in addition to the effects of the several examples described above.

The first example (FIG. 3) has the potential to cause the occurrence of a difference between the reference currents $I_{REF1}$ and $I_{REF2}$ due to the effects of manufacturing variation with respect to transistors that form the current mirror circuit CM1. In a case in which $I_{REF1}$ is not equal to $I_{REF2}$, the frequency of the oscillator circuit 100 is represented by $f_{DIV} = 1/CR \times I_{REF1}/I_{REF2}$.

That is to say, the variation in the reference currents has an effect on the frequency of the oscillator circuit 100.

The oscillator circuit 100L according to the modification 1 ensures that $I_{REF1}$ is equal to $I_{REF2}$. That is to say, this arrangement is capable of solving a problem of the occurrence of variation in the reference currents $I_{REF1}$ and $I_{REF2}$. Such an arrangement is capable of generating a clock with high frequency precision.

Modification 2

The variable-frequency oscillator 102 may be configured as a DCO (Digital Controlled Oscillator). In this case, the charge pump 114 may preferably be replaced by an up/down counter. Furthermore, the loop filter 116 may preferably be configured as a digital filter.

Modification 3

Description has been made in the examples regarding an arrangement in which the F/V converter circuit 120 charges the capacitor C using the reference current $I_{REF1}$, and the voltage across the capacitor C after the charging is used as the detection voltage. However, the present invention is not restricted to such an arrangement. Conversely, a modification may be made in which the capacitor C is discharged using the reference current $I_{REF}$, and the voltage across the capacitor C after the discharging is used as the detection voltage $V_C$.

Modification 4

The waveforms and sequence of the timing signals SEL, RST, and COMP have been shown for exemplary purposes only. The waveform of each signal may be changed as appropriate so long as the same operation is supported. Description has been made with reference to FIGS. 4 and 11 regarding an arrangement in which the charging time $T_{CHG}$ is set to two cycles of the divided clock CLKDIV. However, the present invention is not restricted to such an arrangement. Also, the charging time $T_{CHG}$ may be set to one cycle. In this case, the coefficient A in FIGS. 11 and 12 is set to 1.

The frequency-dividing ratio of the fixed frequency divider 172 may preferably be determined so as to generate an appropriate RST signal, COMP signal, SEL signal, etc.

Modification 6

Description has been made in the examples regarding an arrangement in which the programmable frequency divider 140 has a frequency-dividing ratio that is switchable between three values, i.e., 0, −1, and +1, according to a two-bit modulation signal MOD. However, the present invention is not restricted to such an arrangement. In a case in which the frequency $f_{OSC}$ is required to be corrected only in a direction in which it is increasing (decreasing), the modulation signal may be switched between two values, i.e., 0 and +1 (0 and −1). That is to say, the modulation signal MOD may preferably be designed to have a number of bits according to the required frequency correction range.

Usage

Figure 12A:
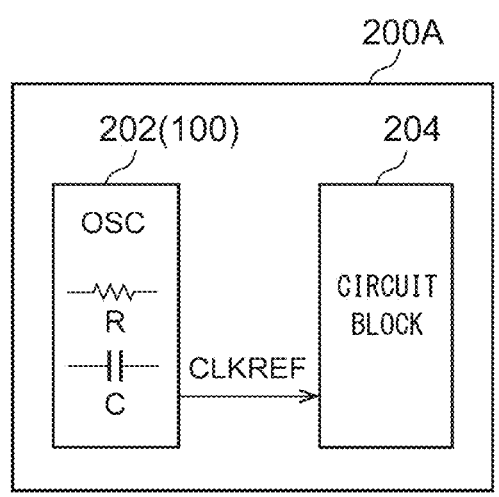
FIG. 12A and FIG. 12B are diagrams each showing a semiconductor apparatus including an oscillator circuit.
Figure 12B:
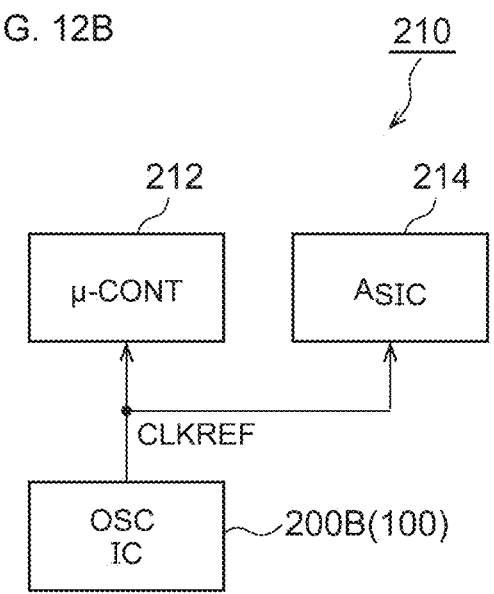

FIGS. 12A and 12B are diagrams each showing a semiconductor apparatus including the oscillator circuit 100. A semiconductor apparatus 200A shown in FIG. 12A includes an oscillator 202 and a circuit block 204. The oscillator 202 is configured as the oscillator circuit 100 described above. The oscillator 202 generates a reference clock CLKREF having a frequency determined according to the capacitance C and the resistance R. The circuit block 204 may include (i) a logic circuit that supports calculation processing in synchronization with the reference clock CLKREF. Alternatively, the circuit block 204 may include (ii) a PLL frequency synthesizer that multiplies the reference clock CLKREF by N so as to generate a high-frequency (RF) signal. The RF signal may be used as a clock for an A/D converter or a D/A converter. Alternatively, the circuit block 204 may include a modulator or a demodulator that supports wireless communication using such an RF signal.

A semiconductor apparatus 200B shown in FIG. 12B is configured as a silicon oscillator IC including the oscillator circuit 100. The silicon oscillator IC is built into a circuit system 210 as a substitution for a conventional quartz oscillator (CXO). The reference clock CLKREF is supplied to a microcontroller 212 or an ASIC (Application Specific Integrated Circuit) 214.

While the preferred embodiments of the present invention have been described using specific terms, such description is for illustrative purposes only, and it is to be understood that changes and variations may be made without departing from the spirit or scope of the appended claims.

What is claimed is:
1. An oscillator circuit comprising:
a variable-frequency oscillator structured to generate an oscillator clock having a frequency that corresponds to a control signal;
a programmable frequency divider structured to divide the oscillator clock so as to generate a divided clock;
a F/V (frequency/voltage) converter circuit comprising a capacitor and a switch structured to switch at a frequency that corresponds to the divided clock, and structured to generate a detection voltage that corresponds to a reference current;
a reference voltage source comprising a resistor, and structured to output a reference voltage that corresponds to an electric potential that occurs across the resistor due to the reference current;
a feedback circuit having low-pass filter characteristics that adjusts the control signal such that the detection voltage approaches the reference voltage;
a temperature sensor structured to detect a temperature; and
a correction circuit structured to change a frequency-dividing ratio to be set for the programmable frequency divider, based on a modulation signal modulated according to a correction coefficient that corresponds to the temperature.

2. The oscillator circuit according to claim 1, wherein the correction circuit comprises:
a calculation unit structured to output the correction coefficient that corresponds to the temperature; and
a delta-sigma modulator structured to modulate the correction coefficient.

3. The oscillator circuit according to claim 2, wherein the feedback circuit comprises a clocked comparator structured to compare the detection voltage with the reference voltage, and a filter circuit,
wherein the F/V converter circuit comprises an initialization switch coupled in parallel with the capacitor, and structured to charge or discharge the capacitor using the reference current, so as to generate the detection voltage,
wherein the oscillator circuit further comprises a timing generator including a fixed frequency divider structured to divide the divided clock, and structured to generate a timing signal for controlling the initialization switch and the clocked comparator,
and wherein a combination of the programmable frequency divider, the fixed frequency divider of the timing generator, and the delta-sigma modulator is configured to operate as a pulse swallow counter.

4. The oscillator circuit according to claim 2, wherein the calculation unit is structured to calculate the correction coefficient in the form of a polynomial expression with the temperature as a variable.

5. The oscillator circuit according to claim 4, wherein the polynomial expression is configured as a quadratic expression.

6. The oscillator circuit according to claim 2, wherein the low-pass filter of the feedback circuit has an order that is equal to or higher than that of the delta-sigma modulator.

7. The oscillator circuit according to claim 1, further comprising a FLL (Frequency Locked Loop) circuit structured to change the correction coefficient such that the frequency of the oscillator clock approaches a frequency of a reference clock input from an external circuit.

8. The oscillator circuit according to claim 7, wherein the FLL circuit is operated at a plurality of temperatures in the calibration mode,
and wherein a parameter for the correction circuit is acquired based on a plurality of temperature coefficients acquired at the plurality of temperatures.

9. The oscillator circuit according to claim 7, wherein the capacitor includes a variable capacitance that can be controlled according to a control code,
and wherein an output of the FLL circuit can be employed as the control code.

10. The oscillator circuit according to claim 3, further comprising a path selector structured to switch a path through which the reference current passes, between a first path and a second path in a time sharing manner,
wherein the capacitor of the F/V circuit is coupled to the first path,
and wherein the resistor of the reference voltage source is coupled to the second path.

11. A semiconductor apparatus comprising:
the oscillator circuit according to claim 1; and
a circuit block structured to receive a clock generated by the oscillator circuit.

12. An oscillator IC (Integrated Circuit) comprising the oscillator circuit according to claim 1.

13. A calibration method for an oscillator circuit, wherein the oscillator circuit comprises:
a variable-frequency oscillator structured to generate an oscillator clock having a frequency that corresponds to a control signal;
a programmable frequency divider structured to divide the oscillator clock so as to generate a divided clock;
a F/V (frequency/voltage) converter circuit comprising a capacitor and a switch structured to switch at a frequency that corresponds to the divided clock, and structured to generate a detection voltage that corresponds to a reference current;
a reference voltage source comprising a resistor, and structured to output a reference voltage that corresponds to an electric potential that occurs across the resistor due to the reference current;
a feedback circuit structured to adjust the control signal such that the detection voltage approaches the reference voltage;
a FLL (Frequency Locked Loop) circuit structured to change an output value thereof such that the frequency of the oscillator clock approaches a frequency of a reference clock input from an external circuit;
a temperature sensor structured to detect a temperature;
a calculation unit structured to output a correction coefficient that corresponds to the temperature;
a delta-sigma modulator structured to generate a modulation signal modulated according to an input signal, and to change a frequency-dividing ratio of the programmable frequency divider; and
a selector structured to select one from among the correction coefficient and an output of the FLL circuit,
and wherein the calibration method comprises:
selecting, by the selector, the output of the FLL circuit;
operating the oscillator circuit at a plurality of temperatures;
setting the FLL circuit to an active state at the plurality of temperatures, and acquiring the output value of the FLL circuit in a frequency-locked state; and
acquiring a parameter for the calculation unit based on the output values of the FLL circuit acquired at the plurality of temperatures.

14. The calibration method according to claim 13, wherein the capacitor includes a variable capacitance that can be controlled according to a control code,
wherein the oscillator circuit is structured to use the output of the FLL circuit as the control code,
wherein the calibration method further comprises:
acquiring the output value of the FLL circuit at a standard temperature in a frequency-locked state in which an output of the FLL circuit is coupled to the variable capacitance so as to fix the frequency-dividing ratio of the programmable frequency-dividing ratio to a reference value thereof; and
storing the output value in a nonvolatile manner as the control code to be supplied to the variable capacitance.

* * * * *